(12) United States Patent
Sumi

(10) Patent No.: US 9,908,719 B2
(45) Date of Patent: Mar. 6, 2018

(54) COMPONENT MOUNTING METHOD

(71) Applicant: Panasonic Intellectual Property Management Co., Ltd., Osaka (JP)

(72) Inventor: Hideki Sumi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 304 days.

(21) Appl. No.: 14/694,298

(22) Filed: Apr. 23, 2015

(65) Prior Publication Data

US 2015/0307288 A1   Oct. 29, 2015

(30) Foreign Application Priority Data

Apr. 24, 2014  (JP) ................................ 2014-089754

(51) Int. Cl.
B65G 47/42  (2006.01)
B65G 47/91  (2006.01)

(52) U.S. Cl.
CPC .................................. B65G 47/917 (2013.01)

(58) Field of Classification Search
CPC ............... H05K 13/04; H05K 13/0404; H05K 13/0417; H05K 13/08; B65G 47/917
See application file for complete search history.

(56) References Cited

FOREIGN PATENT DOCUMENTS

| JP | 6244598 A | * | 9/1994 |
|----|-----------|---|--------|
| JP | 2002-176290 A | | 6/2002 |
| JP | 4675703 B | | 2/2007 |
| JP | 2013-045872 A | | 3/2013 |

* cited by examiner

Primary Examiner — Carl Arbes
(74) Attorney, Agent, or Firm — Pearne & Gordon LLP

(57) ABSTRACT

A suction failure recovering process of a component mounting method includes: executing an imaging process in which an image of a pitch-fed pocket of a carrier tape is obtained; executing a pocket position detection process in which a pocket position is detected; and executing a positional displacement determination process in which it is determined whether the detected pocket position falls into a permissible range or not. When it is determined that the pocket position does not fall into the permissible range, the imaging process, the pocket position detection process and the positional displacement determination process are executed sequentially and repeatedly until the pocket position falls into the permissible range. When it is determined that the pocket position falls into the permissible range, a suction position is corrected based on the pocket position at a time point at which the pocket position falls into the permissible range.

10 Claims, 7 Drawing Sheets

COMPONENT MOUNTING METHOD

BACKGROUND

1. Technical Field

One or more embodiments of the present invention relate to a component mounting method in which a component is picked up from a tape feeder and mounted onto a substrate.

2. Background Art

In a component mounting apparatus, a component mounting operation is performed repeatedly so that components can be picked up from a carrier tape by vacuum suction by a suction nozzle provided in a mounting head, and the picked-up component can be transferred and mounted onto a substrate. The carrier tape is pitch-fed by a tape feeder. During pickup of each component from the tape feeder, there may occur suction failures as failures relevant to component suction, including a suction error in which the component cannot be sucked normally due to some factors during a component suction operation performed by the suction nozzle, a recognition error in which a component holding state is determined as abnormal during component recognition which is performed for determining whether the component holding state after suction of the component is good or not, etc.

These suction failures are often caused by suction positional displacement in a component pickup position, that is, positional displacement between a component receiving pocket provided in the carrier tape and a position where the suction nozzle moves down. JP-B-4675703 describes a method in which a suction position is corrected as needed based on a positional displacement amount detected during pickup of a component. Thus, it is possible to reduce the frequency of occurrence of machine stop caused by any of the suction failures so that it is possible to prevent an apparatus operation rate from deteriorating.

SUMMARY

The above techniques such as example shown in JP-B-4675703 have the following problem. That is, it is difficult to suppress occurrence of a suction failure which cannot be relieved by as-needed correction of the suction position. The suction failure incidentally occurs due to a combined error derived from superimposition of various factors including a mechanism error of a tape feeding mechanism which will be described later, variation in the size and the material of a carrier tape, etc. That is, due to various factors including a pitch error of each feeding pin of a sprocket used in the tape feeding mechanism, a pitch feeding error of a pitch feeding motor, and variation of an engagement condition when the feeding pin is engaged with a feeding hole of the carrier tape, and further including a splice accuracy error when a splice system is used for splicing two carrier tapes to each other through a tape, the tape feeding accuracy of each carrier tape is unstable to thereby cause a suction failure. Whenever the suction failure occurs, the machine stops, and an operator has to check the apparatus state and perform a recovery work manually. This causes deterioration of the apparatus operation rate.

An object of one or more embodiments of the invention is to provide a component mounting method in which a recovery work can be performed automatically when a suction failure occurs due to a combined error derived from superimposition of various factors so that an apparatus operation rate can be prevented from deteriorating.

In one or more embodiments of the invention, there is provided a component mounting method in which a carrier tape provided with pockets receiving components is pitch-fed by a tape feeder and each of the components pitch-fed to a component pickup position is sucked and held by a suction nozzle and mounted onto a substrate, the component mounting method including: executing a suction failure recovering process when a suction failure in which the suction nozzle fails to normally suck and hold a component is detected once or continuously a predetermined number of times or more, wherein the suction failure recovering process includes: executing an imaging process in which the carrier tape is pitch-fed and an image of the pitch-fed pocket is obtained by an imaging unit moved to the component pickup position; executing a pocket position detection process in which recognition processing is performed on the obtained image and a pocket position is detected; and executing a positional displacement determination process in which it is determined whether the detected pocket position falls into a permissible range or not; wherein when it is determined that the pocket position does not fall into the permissible range in the positional displacement determination process, the imaging process, the pocket position detection process and the positional displacement determination process are executed sequentially and repeatedly until the pocket position falls into the permissible range, and wherein when it is determined that the pocket position falls into the permissible range in the positional displacement determination process, a correction process is executed to correct a suction position based on the pocket position at a time point at which the pocket position falls into the permissible range.

According to one or more embodiments of the invention, a recovery work can be performed automatically when a suction failure occurs due to a combined error derived from superimposition of various factors so that an apparatus operation rate can be prevented from deteriorating.

DETAILED DESCRIPTION

Figure 1:
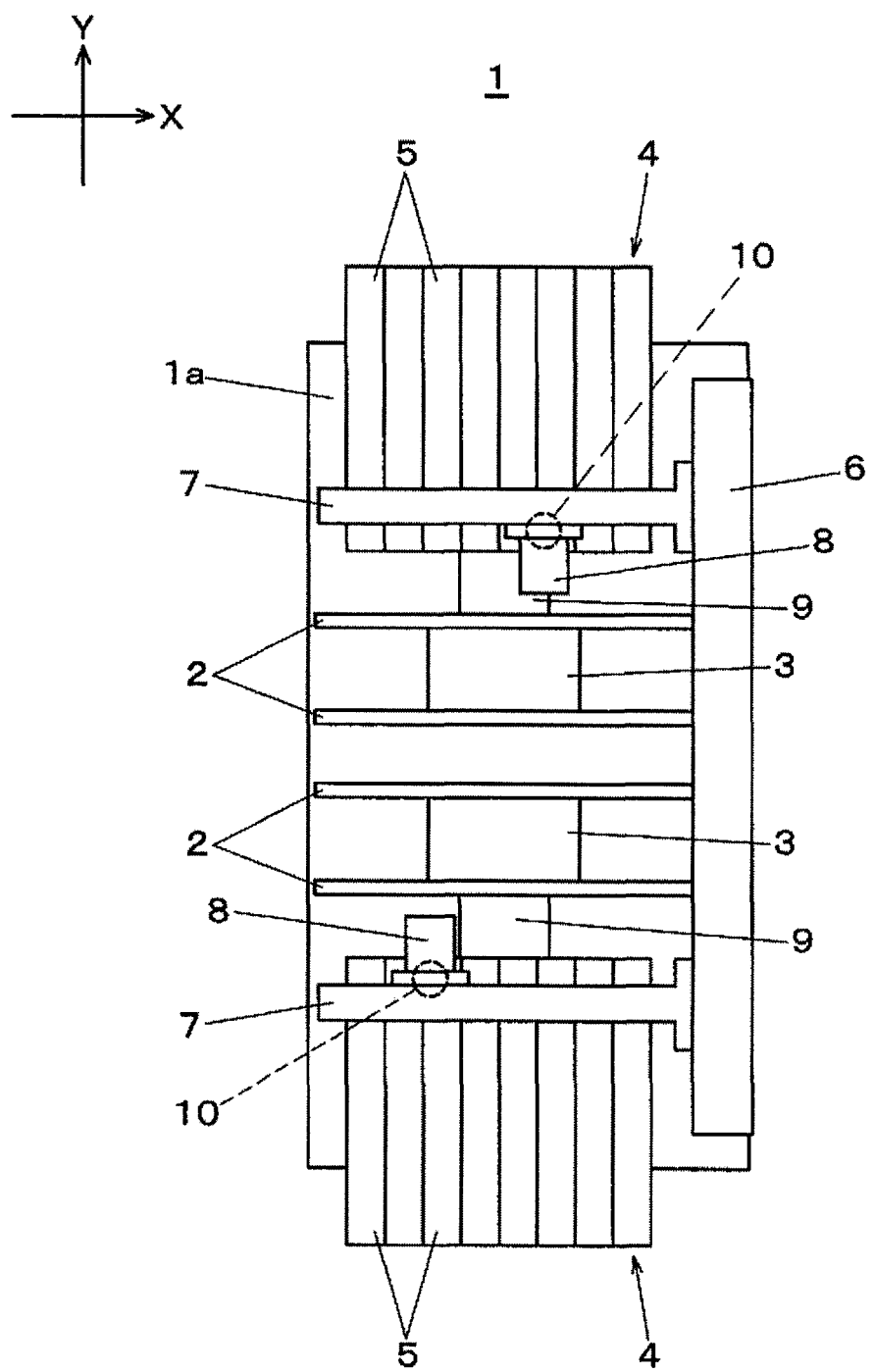
FIG. 1 is a plan view of a component mounting apparatus according to an embodiment of the invention.

A component mounting apparatus 1 according to an embodiment of the invention will be described below with reference to FIG. 1. Substrate conveyance mechanisms 2 are disposed in two rows in the center of a base 1*a*. Each of the substrate conveyance mechanisms 2 conveys a substrate 3 in an X direction and positions the conveyed substrate 3 in a component mounting work position. Component supply portions 4 are disposed on opposite sides of the substrate conveyance mechanisms 2. In each of the component supply portions 4, tape feeders 5 are arranged side by side. Each of the tape feeders 5 pitch-feeds a carrier tape to supply a component to a component pickup position which will be described later.

A Y-axis movement table 6 provided with a linear drive mechanism is disposed on one end portion of an upper surface of the base 1a in the X direction. Two X-axis movement tables 7 each provided with a linear drive mechanism are connected to the Y-axis movement table 6. Mounting heads 8 include suction nozzles 8a (see FIG. 2) in their lower end portions, and are provided with the two X-axis movement tables 7 respectively. The Y-axis movement table 6, the X-axis movement tables 7 and the mounting heads 8 constitute a component mounting mechanism 11 (see FIG. 4). When the component mounting mechanism 11 is driven, the two mounting heads 8 move horizontally, use the suction nozzles 8a to pick up components P (see FIG. 2) from the tape feeders 5, and transfer and mount the picked-up components P onto the positioned substrates 3.

Component recognition cameras 9 are disposed between the component supply portions 4 and the substrate conveyance mechanisms 2 respectively. When the mounting heads 8 having picked-up components P move up, the component recognition cameras 9 obtain images of the components P held by the suction nozzles 8a respectively. Photographic data of each of the obtain images are transmitted to a suction failure detection processing unit 33 (see FIG. 4) of a control unit 30. The suction failure detection processing unit 33 performs recognition processing on the photographic data to detect a recognition error in which the component holding state is determined as abnormal when the component P is not held by the suction nozzle 8a or the component P is not sucked in a right posture.

Substrate recognition cameras 10 are provided with the mounting heads 8. The substrate recognition cameras 10 are located on lower surface sides of the X-axis movement tables 7 and move integrally with the mounting heads 8, respectively. By moving the mounting heads 8, the substrate recognition cameras 10 move to above component pickup positions 5a (see FIG. 3A) of the tape feeders 5. Then, the substrate recognition cameras 10 obtain images of the component pickup positions 5a.

Figure 2:
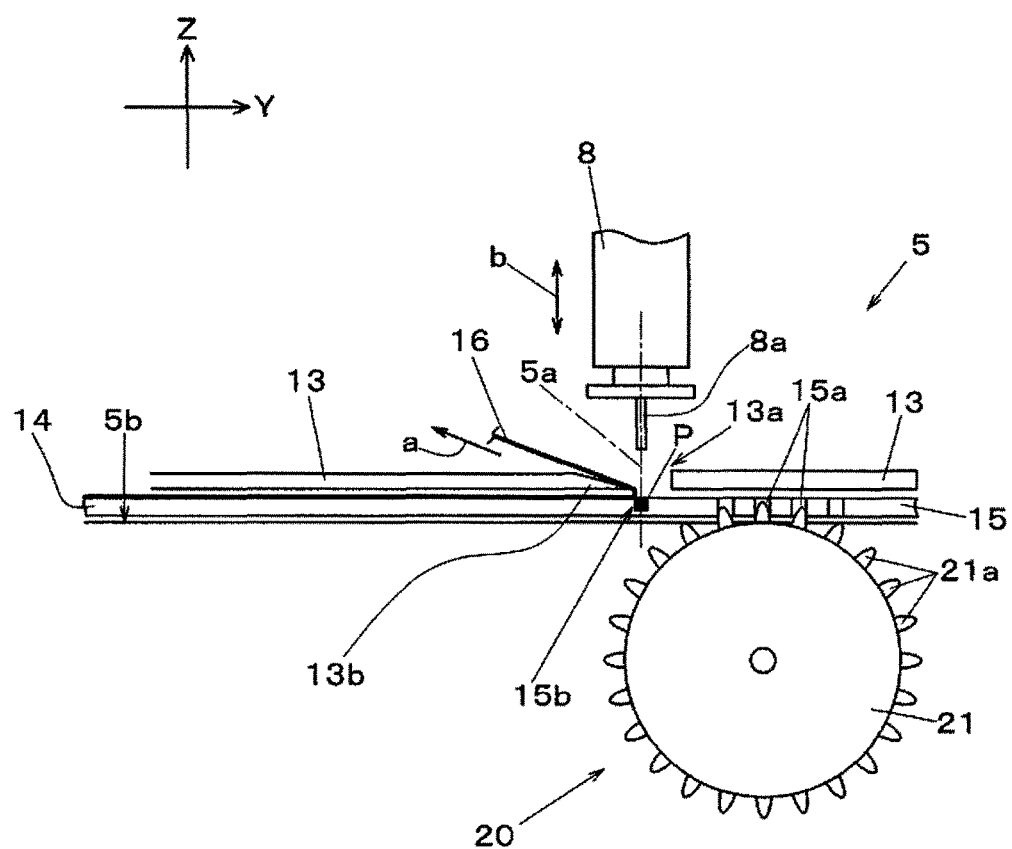
FIG. 2 is an explanatory view of a component pickup operation in a component mounting method according to an embodiment of the invention.

Next, the structure and a pitch feeding operation of each tape feeder 5 will be described with reference to FIG. 2. FIG. 2 is a partially sectional view of the vicinity of the component pickup position 5a of the tape feeder 5. A tape travelling path 5b is provided in the tape feeder 5. A carrier tape 14 is fed to a downstream side (right side in FIG. 2) along an upper surface of the tape travelling path 5b. The carrier tape 14 has a configuration (see FIG. 3B) in which a cover tape 16 is pasted to a base tape 15 to thereby cover upper surfaces of component receiving pockets 15b, the base tape 15 is provided with the component receiving pockets 15b and feeding holes 15a, and each of the component receiving pockets 15b has a recessed shape and receives a component P.

A tape feeding mechanism 20 is provided on a downstream end side of the tape feeder 5. The tape feeding mechanism 20 includes a rotation drive mechanism (not shown) including a pitch feeding motor, and a sprocket 21. Feeding pins 21a to be engaged with the feeding holes 15a provided at a fixed pitch in the base tape 15 are provided in the sprocket 21. The sprocket 21 is rotated and driven by the rotation drive mechanism so that a tape feeding drive force can be transmitted to the feeding holes 15a by the feeding pins 21a. Thus, the carrier tape 14 can be fed toward the downstream side.

The upper surface of the carrier tape 14 on the tape travelling path 5b is covered with a pressing member 13 provided with an opening portion 13a. The pressing member 13 has a function of guiding the carrier tape 14 from the upper surface side. The opening portion 13a is provided on an upstream side of the sprocket 21. The opening portion 13a serves not only as a component pickup opening through which a component P in a component receiving pocket 15b can be picked up, but also as an imaging opening through which an image of the component pickup position 5a can be obtained by the substrate recognition camera 10.

The tape feeding mechanism 20 is connected to a mechanism drive unit 32 (see FIG. 4) of the control unit 30. In addition, mounting data 31a (see FIG. 4) are stored in a storage unit 31 (see FIG. 4) of the control unit 30. The mounting data 31a contain carrier tape information about the kind of components received in the carrier tape 14 and pitch data of the component receiving pockets 15b. Based on the carrier tape information, the control unit 30 controls the mechanism drive unit 32 to drive the tape feeding mechanism 20. Thus, the carrier tape 14 is pitch-fed so that components P can be intermittently fed to the component pickup position 5a.

Next, a cover tape separation operation and a component pickup operation will be described with reference to FIG. 2. The carrier tape 14 fed on the tape travelling path 5b reaches the component pickup position 5a. In this position, of the carrier tape 14, only the cover tape 16 is folded back at an edge portion (separation portion) 13b of the opening portion 13a. The carrier tape 14 is fed while a pulling force is applied to the cover tape 16 in an opposite direction (arrow "a") to the tape feeding direction. In this manner, the cover tape 16 is separated in the vicinity of the edge portion 13b of the opening portion 13a to expose an upper surface of a component receiving pocket 15b. When the suction nozzle 8a is moved up/down (arrow "b") with respect to the component receiving pocket 15b in this state, the suction nozzle 8a abuts against the component P in the suction position so that the component P can be picked up by vacuum suction.

A flow rate sensor 12 (see FIG. 4) is inserted in a vacuum suction circuit from the suction nozzle 8a so that the value of a flow rate of air flowing in through the suction nozzle 8a can be measured. Upon reception of the measurement result, the suction failure detection processing unit 33 detects a suction error in which the suction nozzle 8a cannot suck a component P normally due to various factors including shortage, positional displacement and poor posture of the component P etc. in the component receiving pocket 15b during the aforementioned component pickup operation. Incidentally, although an example in which the suction error is detected based on the value of the flow rate of air measured by the flow rate sensor 12 has been shown in the embodiment, such a suction error may be detected based on another index value than the value of the flow rate, such as vacuum pressure in the vacuum suction circuit.

Figure 3A:
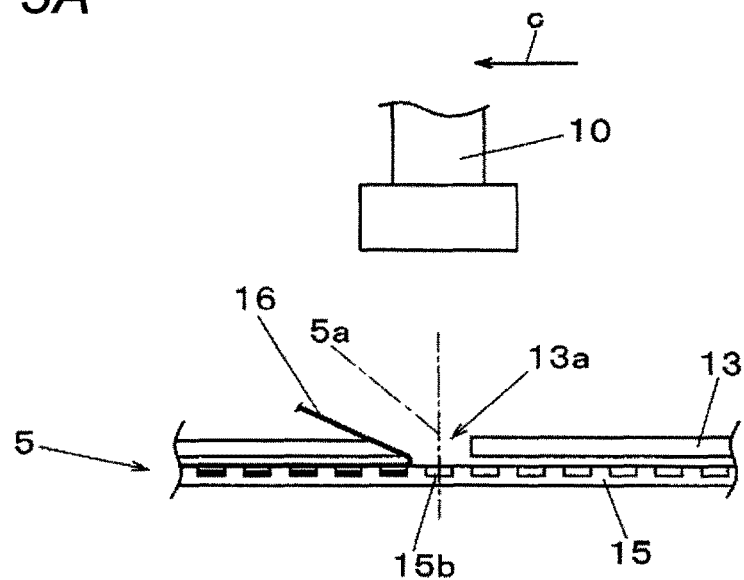
FIGS. 3A and 3B are explanatory views of a pocket position detection process in the component mounting method according to the embodiment of the invention.
Figure 3B:
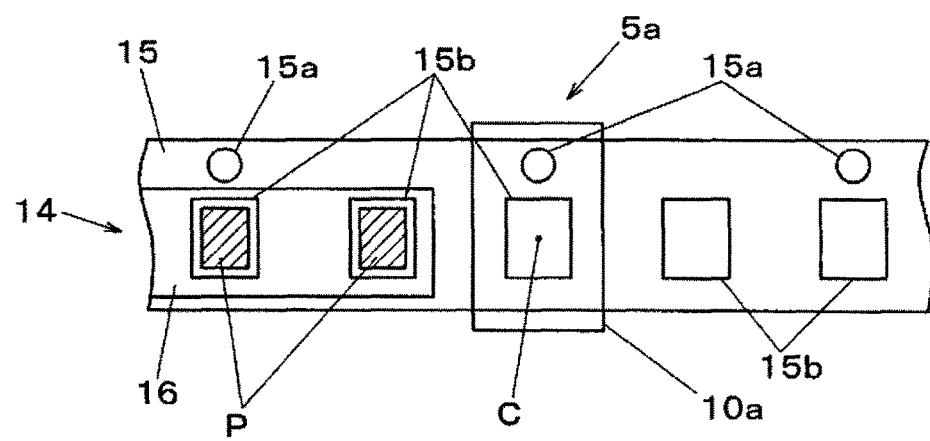

Next, a component pickup position imaging process and a pocket position detection process will be described with reference to FIGS. 3A and 3B. FIG. 3A shows a state in which the substrate recognition camera 10 has moved (arrow "c") to above the component pickup position 5a. In this state, the substrate recognition camera 10 obtains an image of the component pickup position 5a through the opening portion 13a. FIG. 3B shows a state of the carrier tape 14 during a component mounting work when seen from above. In FIG. 3B, the pressing member 13 is not shown. On an upstream side of the component pickup position 5a, components P are received in the carrier tape 14 and the upper surfaces of the components P are covered with the cover tape 16. On the downstream side of the component pickup position 5a, the cover tape 16 has been separated and components P have been picked up from component receiving pockets 15b respectively.

An imaging processing unit 34a (see FIG. 4) of the control unit 30 performs a component pickup position imaging process to receive the photographic data of the obtained image and store the photographic data of the obtained image as pocket image data 31b (see FIG. 4) in the storage unit 31. A pocket position detection unit 34b (see FIG. 4) of the control unit 30 performs a pocket position detection process to perform recognition processing on the stored pocket image data 31b, detect a center position C (hereinafter referred to as "pocket position C") of the component receiving pocket 15b in an imaging field 10a of the substrate recognition camera 10 and store the detected pocket position C as pocket position data 31c (see FIG. 4) in the storage unit 31.

Figure 4:
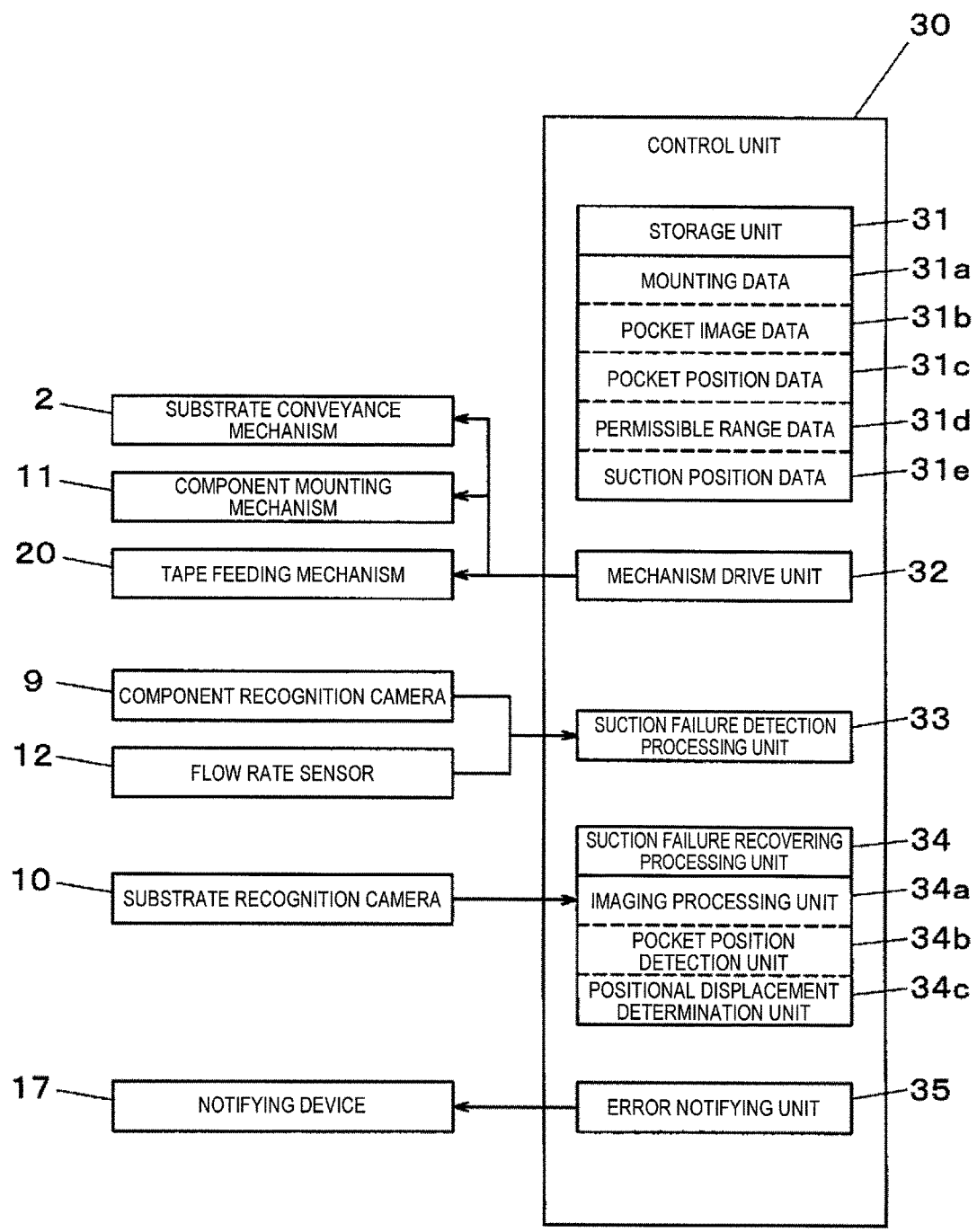
FIG. 4 is a diagram showing a control system of the component mounting apparatus according to the embodiment of the invention.

Next, a control system of the component mounting apparatus 1 will be described with reference to FIG. 4. The control unit 30 provided in the component mounting apparatus 1 includes the storage unit 31, the mechanism drive unit 32, the suction failure detection processing unit 33, a suction failure recovering processing unit 34, and an error notifying unit 35. The control unit 30 is connected with the substrate conveyance mechanism 2, the component mounting mechanism 11, the tape feeding mechanism 20, the component recognition camera 9, the flow rate sensor 12, the substrate recognition camera 10 and a notifying device 17. The control unit 30 may include, e.g., a memory configured to store instructions; and at least one processor configured to execute the instructions to cause the component mounting apparatus 1 to provide at least one of the units provided in the control unit 30 or to execute at least one of the operations of the control device 30.

The storage unit 31 stores the mounting data 31a, the pocket image data 31b, the pocket position data 31c, permissible range data 31d, suction position data 31e, etc. The mounting data 31a include the substrate size, the component kind and the component mounting position about each substrate kind, carrier tape information about the carrier tape type, etc. The pocket image data 31b contain the photographic data of the obtained image of the component pickup position 5a obtained in the aforementioned component pickup position imaging process. The pocket position data 31c contain the data of the pocket position C detected in the aforementioned pocket position detection process.

The permissible range data 31d contain data indicating a permissible range R (see FIGS. 7A to 7C) in which the pocket position C may exist as a position where the component mounting work can be recovered to normal one if the suction position of the mounting head 8 or the pitch feeding amount of the carrier tape 14 is corrected automatically when a suction failure which will be described later occurs. The suction position data 31e contain data showing the suction position where the suction nozzle 8a will suck a component P in the component pickup operation.

The control unit 30 controls the mechanism drive unit 32 to drive the substrate conveyance mechanism 2 to covey and position a substrate 3. In addition, the control unit 30 controls the mechanism drive unit 32 to drive the component mounting mechanism 11 to perform a component mounting work to thereby pick up a component P from the component pickup position 5a and transfer and mount the picked-up component P onto the positioned substrate 3. In addition, the control unit 30 controls the mechanism drive unit 32 to drive the tape feeding mechanism 20 to pitch-feed the carrier tape 14 in the tape feeder 5.

The suction failure detection processing unit 33 performs a suction failure detection process to detect occurrence of a suction failure as a failure relevant to component suction such as the aforementioned recognition error or the aforementioned suction error.

The suction failure recovering processing unit 34 includes the imaging processing unit 34a, the pocket position detection unit 34b, and a positional displacement determination unit 34c. The imaging processing unit 34a performs the aforementioned component pickup position imaging process. The pocket position detection unit 34b performs the aforementioned pocket position detection process. The positional displacement determination unit 34c performs a positional displacement determination process to determine whether the stored pocket position C falls into the stored permissible range R or not.

The error notifying unit 35 activates the notifying device 17 to notify an operator of the error when the pocket position C still does not fall into the permissible range R even after pitch feeding of the carrier tape 14 has been repeated a predetermined number of times in steps of a retry number determination process which will be described later. Any unit such as a signal tower, a revolving light, or a buzzer may be used as the notifying device 17 as long as it is a device which can notify the operator of the error.

Figure 5:
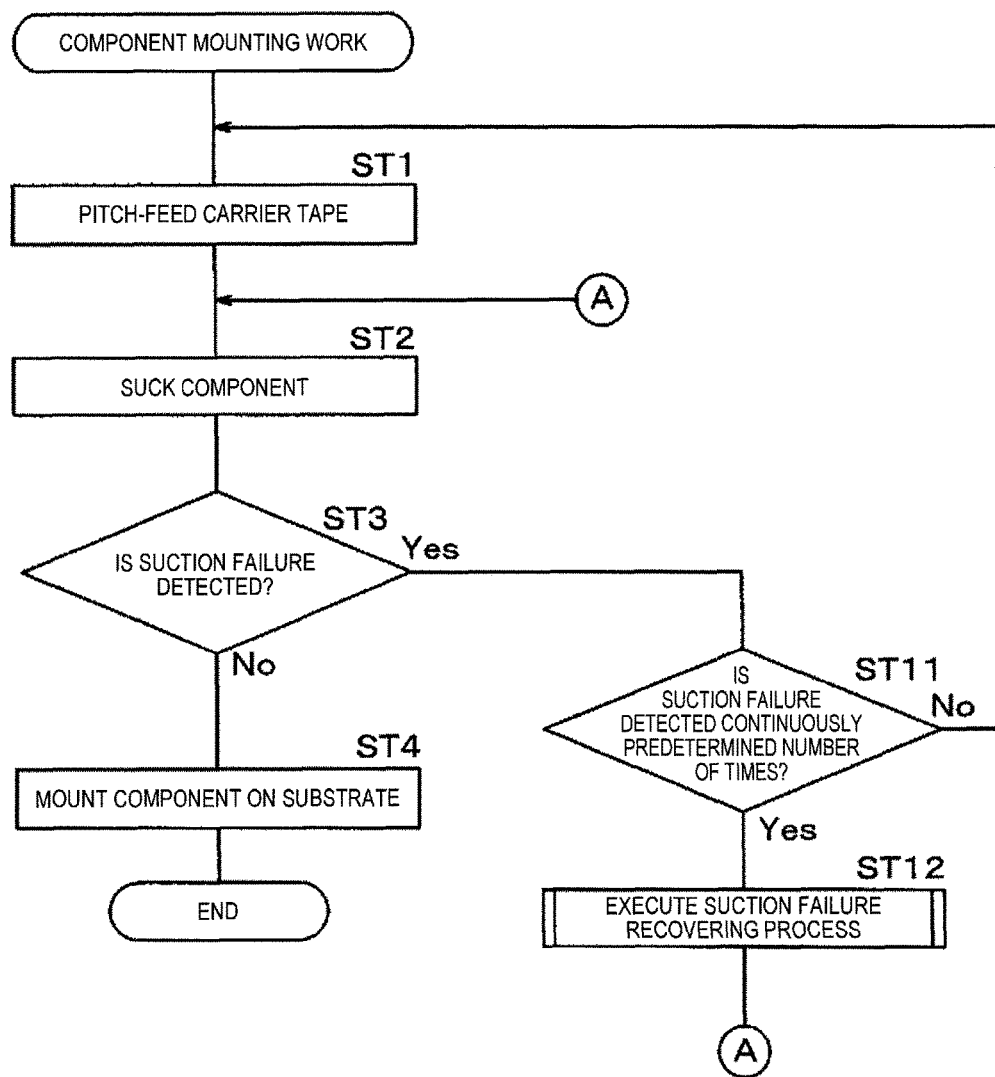
FIG. 5 is a flow chart of a component mounting operation in the component mounting method according to the embodiment of the invention.
Figure 6:
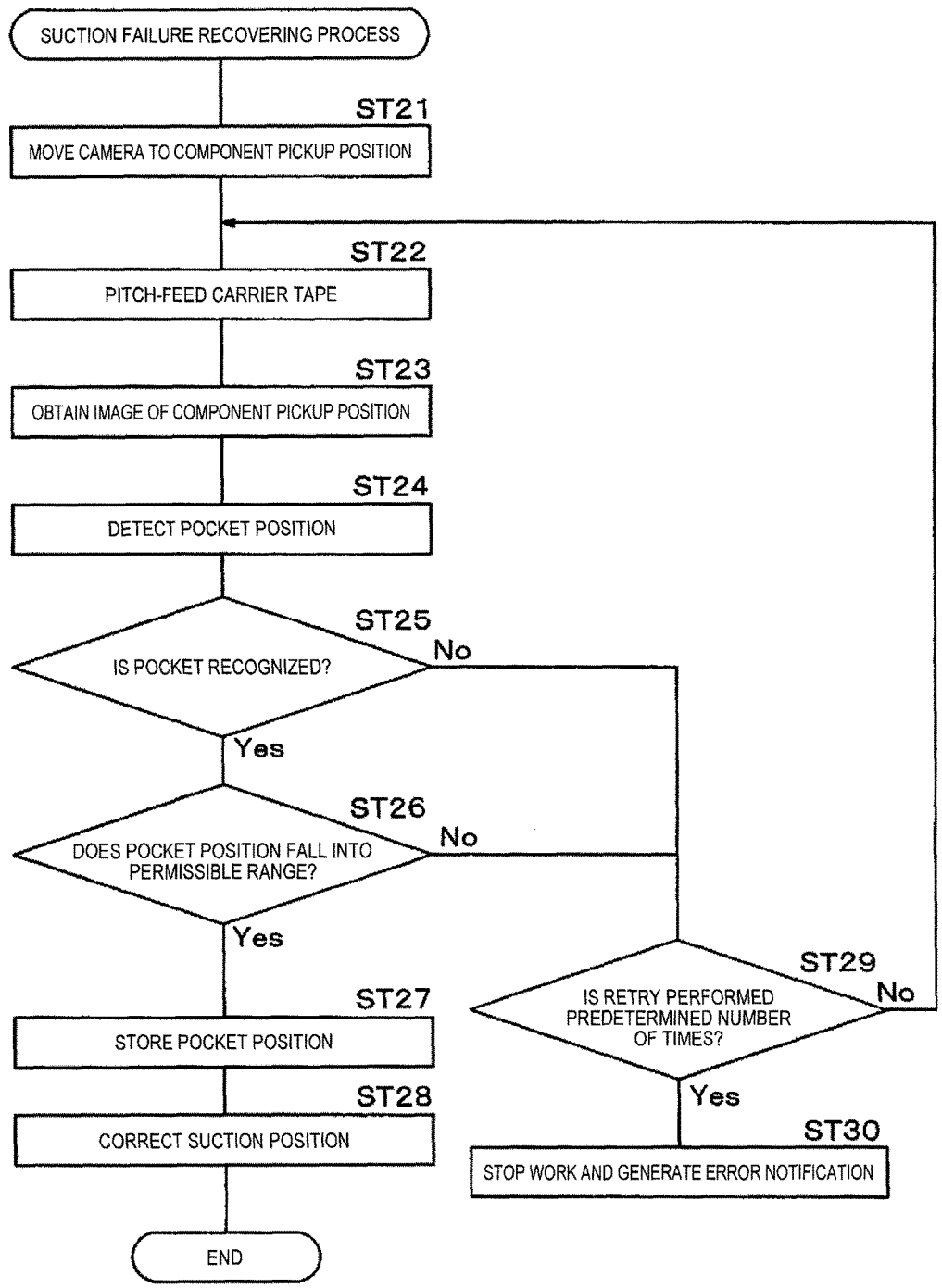
FIG. 6 is a flow chart of a suction failure recovering process in the component mounting method according to the embodiment of the invention.

The component mounting apparatus 1 in the embodiment of the invention is configured as described above. Next, a component mounting method in an embodiment of the invention will be described in accordance with flow charts of FIGS. 5 and 6 and with reference to FIGS. 7A to 7C.

During a component mounting work, the control unit 30 controls the above-described units provided therein to execute the respective processes as follows. First, the control unit 30 makes control to pitch-feed a carrier tape 14 to feed a component P to the component pickup position 5a (ST1) and suck the component P by the suction nozzle 8a (ST2). Then, the control unit 30 executes a suction failure detection process to detect and determine whether a suction failure has occurred or not (ST3: suction failure detection/determination step). When no suction failure is detected in the suction failure detection/determination step (ST3), the control unit 30 makes control to transfer and mount the component P held by the suction nozzle 8 onto a substrate 3 (ST4).

When occurrence of a suction failure is detected in the suction failure detection/determination step (ST3), the control unit 30 then determines whether the suction failure has been detected continuously a predetermined number of times or not (ST11: continuous suction failure determination step). In the continuous suction failure determination step (ST11), when it is determined that the suction failure has not been detected continuously the predetermined number of times, the control unit 30 returns to the step (ST1) to continue the component mounting work. In the continuous suction failure determination step (ST11), when it is determined that the suction failure has been detected continuously the predetermined number of times (e.g. three times) or more, the control unit 30 executes a suction failure recovering process which will be described later (ST12: suction failure recovering process). That is, the control unit 30 executes the suction failure recovering process when the suction failure in which the suction nozzle 8a cannot suck and hold the component P normally has been detected continuously the predetermined number of times or more. Incidentally, the continuous number of times of the suction failure determined in the continuous suction failure determination step (ST11) may be one. That is, when the suction failure has been detected once, the control unit 30 may execute the suction failure recovering process.

In the suction failure recovering process, first, the control unit 30 makes control to move the substrate recognition camera 10 as an imaging unit to the component pickup position 5a (ST21: imaging unit moving step). Then, the control unit 30 makes control to pitch-feed the carrier tape 14 (ST22: pitch feeding step) and execute a component pickup position imaging process to obtain an image of the component pickup position 5a (ST23: pocket imaging step). That is, a series of steps including the pitch feeding step (ST22) and the pocket imaging step (ST23) serves as an example of an imaging process in which the control unit 30 makes control to pitch-feed the carrier tape 14 and obtain an image of the pitch-fed component receiving pocket 15b by the imaging unit which has been moved to the component pickup position 5a. Then, the control unit 30 executes a pocket position detection process to perform recognition processing on the obtained image so as to detect a pocket position C (ST24: pocket position detection step).

Then, the control unit 30 determines whether the component receiving pocket 15b can be recognized or not (ST25: pocket recognition determination step). In the pocket recognition determination step (ST25), when it is determined that the component receiving pocket 15b can be recognized, the control unit 30 executes a positional displacement determination process to determine whether the detected pocket position C falls into a permissible range R which has been set in advance or not (ST26: positional displacement determination step). When it is determined in the pocket recognition determination step (ST25) that the component receiving pocket 15b cannot be recognized, or when it is determined in the positional displacement determination step (ST26) that the pocket position C does not fall into the permissible range R, the control unit 30 determines whether a series of steps (hereinafter referred to as "retry") including the pitch feeding step (ST22), the pocket imaging step (ST23), the pocket position detection step (ST24), the pocket recognition determination step (ST25) and the positional displacement determination step (ST26) has been repeated a predetermined number of times or not (ST29: retry number determination step).

In the retry number determination step (ST29), when it is determined that the retry has not been repeated the predetermined number of times, the control unit 30 returns to the pitch feeding step (ST22) to execute the retry (ST22 to ST26) again. That is, in the positional displacement determination step (ST26), when it is determined that the pocket position C does not fall into the permissible range R, the control unit 30 executes the imaging process, the pocket position detection step (ST24) and the positional displacement determination step (ST26) sequentially and repeatedly until the pocket position C falls into the permissible range R.

In the positional displacement determination step (ST26), when it is determined that the pocket position C falls into the permissible range R, the control unit 30 stores the pocket position C (ST27: pocket position storage step) and corrects the suction position data 31e based on the stored pocket position C (ST28: correction step). That is, in the positional displacement determination step (ST26), when it is determined that the pocket position C falls into the permissible range R, the control unit 30 executes the correction step to correct the suction position based on the pocket position C at a time point at which the pocket position C has fallen into the permissible range R.

Figure 7A:
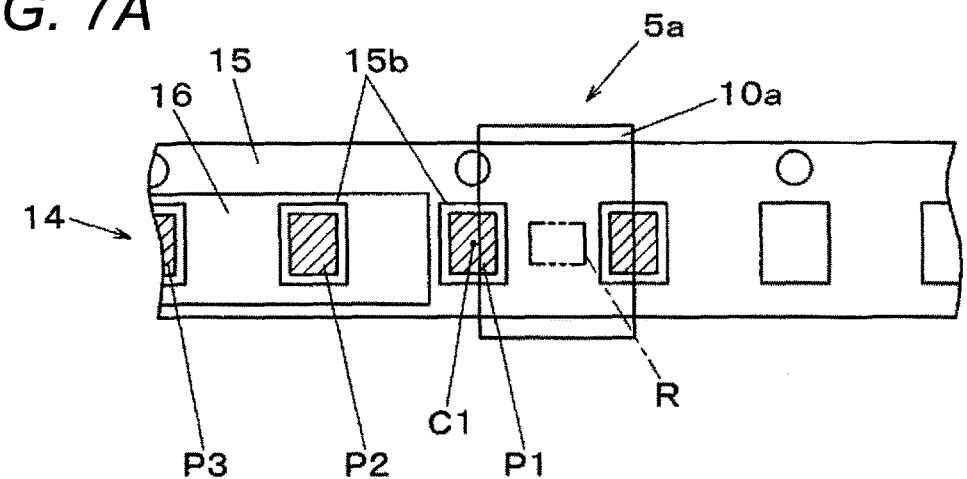
FIGS. 7A to 7C are explanatory views of steps of the suction failure recovering process in the component mounting method according to the embodiment of the invention.
Figure 7B:
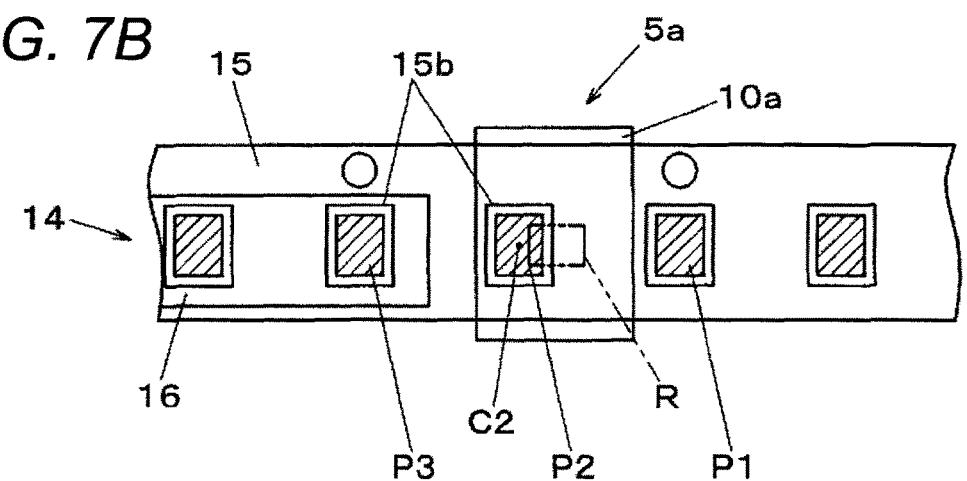
Figure 7C:
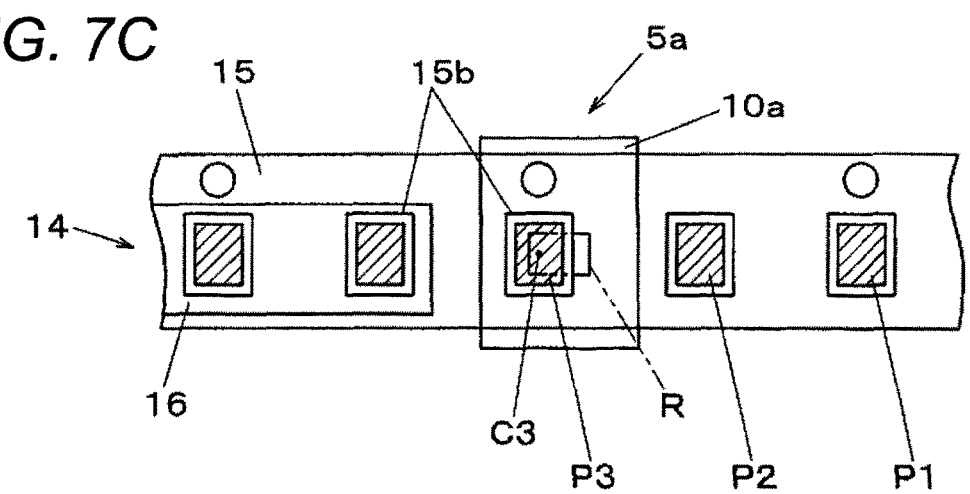

Here, steps of the suction failure recovering process will be described specifically with reference to FIGS. 7A to 7C. FIGS. 7A, 7B and 7C show sequential states of the carrier tape 14 which is pitch-fed sequentially due to the retry executed when the pocket position C does not fall into the permissible range R in the suction failure recovering process. Although the control unit 30 makes control to feed the carrier tape 14 by one pitch of a component receiving pocket 15b at every pitch feeding, the pitch feeding amount may incidentally vary largely due to a combined error etc. derived from superimposition of various factors. The example of FIGS. 7A to 7C shows a state in which the suction failure recovering process is executed after a component receiving pocket 15b has stopped at a large distance from a desired component pickup position 5a and caused a suction failure due to a large variation of the pitch feeding amount.

FIG. 7A shows a state in which one component receiving pocket 15b receiving a component P1 still comes out of the imaging field 10a of the substrate recognition camera 10 in a carrier tape 14 which has been pitch-fed after the occurrence of a suction failure. In this state, a pocket position C1 is not detected in a pocket position detection process of the pocket position detection step (ST24). Accordingly, in the pocket recognition determination process (ST25), it is determined that the component receiving pocket 15b cannot be recognized. When the retry has not been repeated a predetermined number of times, the retry is executed.

FIG. 7B shows the carrier tape 14 which has been pitch-fed due to the retry executed in the state of FIG. 7A. In FIG. 7B, another component receiving pocket 15b receiving a component P2 is located within the imaging field 10a. Accordingly, a pocket position C2 is detected in the pocket position detection process. However, since the detected pocket position C2 is located out of the permissible range R, in the positional displacement determination step (ST26), it is determined that the pocket position C2 does not fall into the permissible range R. When the retry has not been repeated the predetermined number of times, the retry is executed.

FIG. 7C shows the carrier tape 14 which has been pitch-fed again due to the retry executed in the state of FIG. 7B. In FIG. 7C, a component receiving pocket 15b receiving a component P3 is located within the imaging field 10a. Accordingly, a pocket position C3 is detected in the pocket position detection process. Further, since the detected pocket position C3 is located within the permissible range R, in the positional displacement determination step (ST26), it is determined that the pocket position C3 falls into the permissible range R. The suction position is corrected based on the pocket position C3.

In the retry number determination step (ST29), when it is determined that the retry has been repeated the predetermined number of times (e.g. five times), the control unit 30 stops the component mounting work and notifies the operator of an error in which the component cannot be sucked normally (ST30). Thus, in the suction failure recovering step (ST12), the control unit 30 makes control to generate a notification of the error when the pocket position C does not fall into the permissible range R even after pitch feeding of the carrier tape 14 has been repeated the predetermined number of times. In this time, another mounting head 8 in which the suction failure has not been detected can continue the component mounting operation. When notified of the error, the operator checks the apparatus state and performs a recovery operation manually.

After having performed the correction step (ST28), the control unit 30 completes a series of the steps of the suction failure recovering process (ST12) and returns to the step (ST2). Based on the suction position data 31e which have been corrected in the aforementioned correction step (ST28), the control unit 30 then continues the component mounting work. That is, the recovery work can be performed automatically when the suction failure occurs.

As described above, in some cases, due to a combined error derived from superimposition of various factors during the component mounting work, a component P pitch-fed may stop at a large distance from the suction position and incidentally cause a suction failure. However, such a positional displacement of the component P caused by a combined error is likely to occur locally in a part of the carrier tape 14. Therefore, when pitch feeding is performed repeatedly, the factors of the error are often relieved so that the stop position of the component P can be brought back to the normal position.

If the work is resumed in the state in which the stop position of the component P has not been brought back to the normal position (in the state in which displacement of the pocket position C is still large) after the suction failure occurred, even after the component mounting work is restarted, the correction amount of the suction position is large, whereby the suction failure may be repeated. On the other hand, in the component mounting method according to the embodiment of the invention, when the suction failure has been detected once or continuously a predetermined number of times or more, pitch feeding is performed repeatedly until the pocket position C falls into the permissible range R which has been set in advance. The suction position is corrected based on the pocket position C which has fallen into the permissible range R. In this manner, recovery of the component mounting work can be performed automatically and the suction failure can be prevented when the component mounting work is restarted.

In the component mounting method according to the embodiment, a most suitable permissible range R which has been obtained by experiments or the like is set in advance and pitch feeding is performed repeatedly until the pocket position C falls into the permissible range R. Thus, a proper correction amount can be obtained. When correction is made with the proper correction amount, the recovery work can be performed automatically so that an apparatus operation rate can be prevented from deteriorating. In addition, the suction failure can be also prevented when the component mounting work is restarted. Further, when the pocket position C cannot fall into the permissible range R even after pitch feeding has been performed repeatedly a predetermined number of times, an operator is notified of an error indicating that fact so that a work burden on the operator checking the apparatus state can be reduced.

According to one or more embodiments of the invention, there is an effect that a recovery work can be performed automatically when a suction failure occurs due to a combined error derived from superimposed of various factors so that an apparatus operation rate can be prevented from deteriorating. Accordingly, one or more embodiments of the invention are useful in the field in which a component is picked up from a tape feeder and mounted onto a substrate.

What is claimed is:

1. A component mounting method in which a carrier tape provided with pockets receiving components is pitch-fed by a tape feeder and each of the components pitch-fed to a component pickup position is sucked and held by a suction nozzle and mounted onto a substrate, said component mounting method comprising:
   executing a suction failure recovering process when a suction failure in which the suction nozzle fails to normally suck and hold a component is detected once or continuously a predetermined number of times or more,
   wherein the suction failure recovering process comprises:
      executing an imaging process in which the carrier tape is pitch-fed and an image of the pitch-fed pocket is obtained by an imaging unit moved to the component pickup position;
      executing a pocket position detection process in which recognition processing is performed on the obtained image and a pocket position is detected;
      executing a positional displacement determination process in which it is determined whether the detected pocket position falls into a permissible range or not;
   wherein when it is determined that the pocket position does not fall into the permissible range in the positional displacement determination process, the imaging process, the pocket position detection process and the positional displacement determination process are executed sequentially and repeatedly until the pocket position falls into the permissible range, and
   wherein when it is determined that the pocket position falls into the permissible range in the positional displacement determination process, a correction process is executed to correct a suction position based on the pocket position at a time point at which the pocket position falls into the permissible range; and
   mounting the component onto the substrate.

2. The component mounting method according to claim 1, further comprising:
   generating an error notification when the pocket position does not fall into the permissible range even after pitch feeding of the carrier tape has been performed repeatedly a predetermined number of times in the suction failure recovering process.

3. The component mounting method according to claim 1, wherein it is determined whether a center of the pocket falls into a permissible range or not in the pocket position detection process.

4. The component mounting method according to claim 1, wherein the permissible range is a range in which if the pocket position exists, a component mounting can be recovered to normal condition by correcting the component pick-up position.

5. A component mounting method in which a carrier tape provided with pockets receiving components is pitch-fed by a tape feeder and each of the components pitch-fed to a component pickup position is sucked and held by a suction nozzle and mounted onto a substrate, said component mounting method comprising:
   executing an imaging process in which the carrier tape is pitch-fed and an image of the pitch-fed pocket is obtained by an imaging unit moved to the component pickup position;
   executing a pocket position detection process in which recognition processing is performed on the obtained image and a pocket position is detected;
   executing a positional displacement determination process in which it is determined whether the detected pocket position falls into a permissible range or not, wherein when it is determined that the pocket position does not fall into the permissible range in the positional displacement determination process, the imaging process, the pocket position detection process and the positional displacement determination process are executed sequentially and repeatedly until the pocket position falls into the permissible range; and mounting the component onto the substrate.

6. The component mounting method according to claim 4, wherein when it is determined that the pocket position falls into the permissible range in the positional displacement determination process, a correction process is executed to correct a suction position based on the pocket position at a time point at which the pocket position falls into the permissible range.

7. The component mounting method according to claim 4, further comprising:

generating an error notification when the pocket position does not fall into the permissible range even after pitch feeding of the carrier tape has been performed repeatedly a predetermined number of times in the suction failure recovering process.

8. The component mounting method according to claim 4, wherein the imaging process, the pocket position detection process and the positional displacement determination process are included in a suction failure recovering process, wherein the suction failure recovering process is executed when a suction failure in which the suction nozzle fails to normally suck and hold a component is detected once or continuously a predetermined number of times or more.

9. The component mounting method according to claim 4, wherein it is determined whether a center of the pocket falls into a permissible range or not in the pocket position detection process.

10. The component mounting method according to claim 4, wherein the permissible range is a range in which if the pocket position exists, a component mounting can be recovered to normal condition by correcting the component pick-up position.

* * * * *